US006603960B1

(12) United States Patent
Oida et al.

(10) Patent No.: US 6,603,960 B1
(45) Date of Patent: Aug. 5, 2003

(54) TRANSMISSION OUTPUT CONTROL DEVICE, AND RADIO EQUIPMENT INCLUDING THE SAME

(75) Inventors: Toshifumi Oida, Omihachiman (JP); Masaki Kimura, Shiga-ken (JP); Satoshi Ishino, Kusatsu (JP); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/534,271

(22) Filed: Mar. 24, 2000

(30) Foreign Application Priority Data

Mar. 29, 1999 (JP) .......................................... 11-086111

(51) Int. Cl.[7] .......................... H03C 1/62; H04B 17/00; H04B 1/04

(52) U.S. Cl. ....................................................... 455/115

(58) Field of Search ................................ 455/126, 127; 330/246

(56) References Cited

U.S. PATENT DOCUMENTS 4,476,447 A 10/1984 Lauchner .................... 333/111
5,187,455 A * 2/1993 Mandai et al. .............. 333/156
5,229,726 A * 7/1993 Kent .......................... 324/608
5,929,729 A * 7/1999 Swarup ....................... 333/116
6,336,593 B1 * 1/2002 Bhatnagar ................. 236/78 R

FOREIGN PATENT DOCUMENTS

| | | |
|---|---|---|
| EP | 0604203 | 12/1993 |
| JP | 6283908 | 10/1994 |
| JP | 6334401 | 12/1994 |

OTHER PUBLICATIONS

European Search Report dated Jul. 28, 2000.

* cited by examiner

*Primary Examiner*—Nguyen T. Vo
*Assistant Examiner*—David Nguyen
(74) *Attorney, Agent, or Firm*—Keating & Bennett, LLP

(57) ABSTRACT

A transmission output control device comprising: a directional coupler which branches a part of an amplified transmission signal from a high output amplifier; and a detector which detects a part of said branched transmission signal; wherein the directional coupler and the detector are integrated in a laminated body in which a plurality of dielectric layers are laminated.

15 Claims, 8 Drawing Sheets

TRANSMISSION OUTPUT CONTROL DEVICE, AND RADIO EQUIPMENT INCLUDING THE SAME

BACKGROUND OF THE INVENTION

1. Field of the Invention

The present invention relates to a transmission output control device and radio equipment including the same, and more specifically, a transmission output control device to control the transmission signal to be emitted from an antenna, and a radio equipment including the same.

2. Description of the Related Art

Generally, in radio equipment such as some cellular phone terminals, the transmission output level of the transmission signal at the terminal is switched in multiple stages or continuously, in response to instructions from a base station, to reduce power consumption or to reduce interference with other terminals.

FIG. 10 is a block diagram illustrating a basic constitution of a transmission part of the cellular phone terminal with circuits for controlling the transmission output as described above. A transmission output control device 50 is provided with a directional coupler 51 and a detector 52.

A carrier-wave signal generated in an oscillator 53 is converted into the transmission signal through various processing circuits including an amplifier 54, and inputted to a high output amplifier 55. The transmission signal amplified by this high output amplifier 55 is inputted to an antenna multicoupler 56 through the directional coupler 51, and transmitted by an antenna 57 after unwanted signals are removed by the antenna multicoupler 56. Further, a reception signal received by the antenna 57 is inputted to a reception part Rx after unwanted signals are removed by the antenna multicoupler 56. The instruction information for controlling the transmission output level of the transmission signal is included in the above-described reception signal from the base station.

The directional coupler 51 comprises a main line 51-1 and a sub line 51-2, whereby part of the transmission signal from the high output amplifier 55 is branched, that is, taken out from one end of the sub line 51-2 and inputted to the detector 52. A terminating resistor R51 is connected to the other end of the sub line 51-2. In the detector 52, the transmission signal is rectified by a detection diode D51, smoothed by a smoothing capacitor C51 and then, changed into a detection signal by a load resistor R52. The detection signal is inputted to a control circuit 58 as the TSSI (Transmitting Signal Strength Indicator) signal corresponding to the transmission output level of the transmission signal actually being transmitted from the antenna 57.

A control part 59 provides a control signal to the control circuit 58 to indicate a target transmission output level, in response to an instruction from a base station not indicated in the figure. The control circuit 58 generates a feedback (FB) signal in response to the control signal from the control part 59, having such a value as to reduce the difference between the actual transmission output level as indicated by the TSSI signal and the target transmission output level. The FB signal is outputted to a control terminal Tc which is capable of controlling the high output amplifier 55 in order to set the actual transmission output level.

As described above, a transmission output control system a part of which comprises the transmission output control device 50 forms a feedback loop, and controls the transmission output level so that the actual transmission output level is changed to the target transmission output level as specified by the control part 59.

Recently in North America, a dual-band type cellular phone terminal which is usable in both the AMPS (Advanced Mobile Phone Services: 800 MHZ) band and the PCS (Personal Communication Services: 1900 MHZ) band has been developed.

FIG. 11 is a block diagram illustrating a basic constitution of a transmission part of the above-described dual-band type cellular phone terminal. A transmission output control device 60 is provided with first and second directional couplers 61*a*, 61*b* and a detector 62. The transmission output control device 60 constitutes the transmission output control system forming the feedback loop together with first and second high output amplifiers 63*a*, 63*b*, a control circuit 64 and a control part 65. The operation of the transmission output control system including the transmission output control device 60 is the same as that of the transmission output control system including the transmission output control device 50 of FIG. 10.

The conventional transmission output control devices described above are formed by respectively mounting discrete parts constituting a directional coupler, a detector and a tuner on a circuit substrate. As a result, the transmission output control device and the entire radio equipment are increased in size.

Further, because the discrete parts constituting the directional coupler, the detector and the tuner of the transmission output control device are connected to each other by wiring provided on the circuit substrate, losses due to the wiring are increased, and there has been a problem that the characteristic of the transmission output control device is degraded.

In addition, in the dual-band equipment, a gap between the two directional couplers must be ensured to obtain isolation between them, and thus, the transmission output control device and the entire radio equipment are further increased in size.

SUMMARY OF THE INVENTION

To overcome the above described problems, embodiments of the present invention provide a compact transmission output control device with excellent characteristics and radio equipment including the same.

One embodiment of the present invention provides a transmission output control device comprising: a directional coupler which branches a part of a transmission signal amplified by a high output amplifier; and a detector which detects a part of said branched transmission signal; wherein said directional coupler and said detector are integrated in a laminated body comprising a plurality of dielectric layers.

According to the above described structure and arrangement, all the wiring of the directional coupler and the detector can be provided inside the laminated body because the directional coupler and the detector which constitute the transmission output control device are integrated within the laminated body. Thus, the loss in each portion of the wiring can be reduced, so that the transmission output control device with excellent characteristic can be obtained.

In the above described transmission output control device, the directional coupler may include a main line and a sub line; the detector may include a detection diode, a smoothing capacitor and a load resistor; the detection diode and the load resistor of the detector may be mounted on the outside of the laminated body; the main line and the sub line of the directional coupler may comprise strip line electrodes provided inside the laminated body; and the smoothing capacitor of the detector may comprise a capacitor electrode and a ground electrode arranged opposite each other on opposite sides of one or more of said dielectric layers inside said laminated body.

According to the above described structure and arrangement, the number of parts of the transmission output control device can be reduced because the main line and the sub line of the directional coupler comprise strip line electrodes provided inside the laminated body, and the smoothing capacitor of the detector comprises the capacitor electrode and the ground electrode provided inside the laminated body. Thus, a compact transmission output control device can be obtained, and the area occupied by the transmission output control device can be reduced in radio equipment in which this transmission output control device is mounted.

In the above described transmission output control device, a plurality of directional couplers may be provided; and the plurality of said directional couplers may be usable for controlling transmission signals of different frequencies and disposed on different ones of the plurality of dielectric layers. Thus, sufficient isolation between a plurality of directional couplers can be ensured. As a result, a transmission output control device with excellent characteristics can be obtained.

Another embodiment of the present invention provides radio equipment including the above described transmission output control device. According to the above described structure and arrangement, the radio equipment can be made compact while keeping excellent transmission characteristic because a compact transmission output control device with excellent characteristic is used.

Other features and advantages of the present invention will become apparent from the following description of embodiments of the invention which refers to the accompanying drawings.

DESCRIPTION OF EMBODIMENTS OF THE INVENTION

Figure 1:
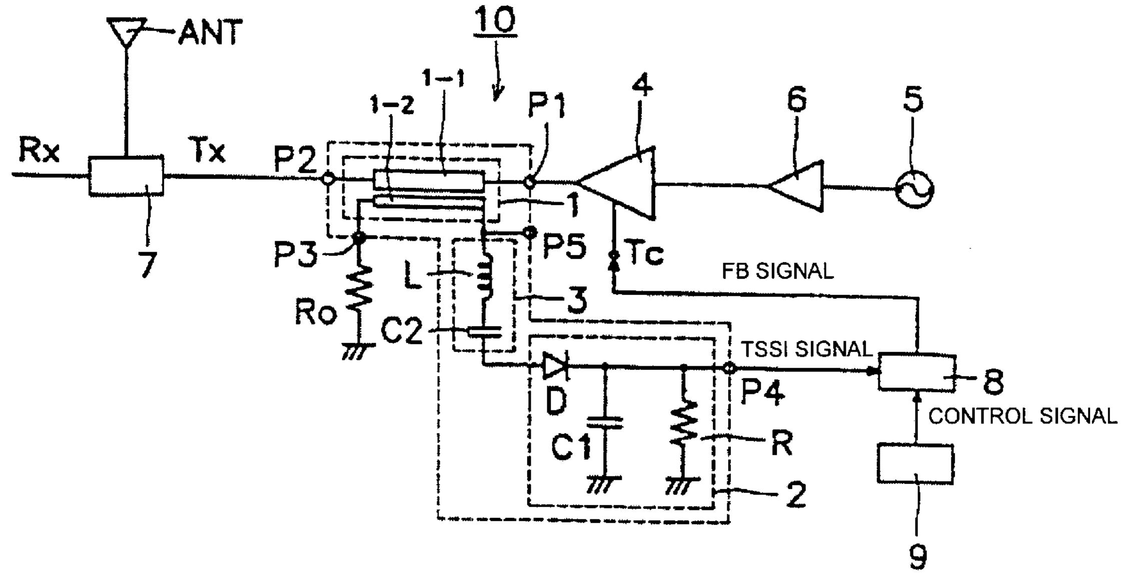
FIG. 1 is a block diagram illustrating a basic constitution of a transmission part of radio equipment using a first embodiment of a transmission output control device of the present invention.

FIG. 1 is a block diagram illustrating a basic constitution of a transmission part of radio equipment using a first embodiment of a transmission output control device of the present invention. In a transmission part Tx, a transmission output control device 10 is provided with a directional coupler 1 comprising a main line 1-1 and a sub line 1-2, a detector 2 comprising a detection diode D, a smoothing capacitor C1 and a load resistor R, a tuner 3 comprising an inductor L and a capacitor C2, and first to fourth terminals P1–P4.

The directional coupler 1 branches a part of the transmission signal amplified by a high output amplifier 4, and the detector 2 detects the part of the transmission signal branched by the directional coupler 1. The tuner 3 is arranged between the directional coupler 1 and the detector 2 and its function is to perform impedance matching between the directional coupler 1 and the detector 2.

The first and second terminals P1, P2 are provided on both ends of the main line 1-1 of the directional coupler 1. The third terminal P3 is provided on one end of the sub line 1-2 of the directional coupler 1, and a terminating resistor Ro is connected thereto. In addition, the fourth terminal P4 is provided on an output end of the detector 2. A fifth terminal P5 is provided between the directional coupler 1 and the tuner 3, and is used in evaluating the characteristcs of only the directional coupler 1.

A carrier-wave signal generated in an oscillator 5 is converted into the transmission signal through various processing circuits including an amplifier 6, and inputted to the high output amplifier 4. The transmission signal amplified by the high output amplifier 4 is inputted to an antenna multicoupler 7 through the first terminal P1, the directional coupler 1 and the second terminal P2, and transmitted from an antenna ANT after unwanted signals are removed by the antenna multicoupler 7.

Further, the signal received by the antenna ANT is inputted to a reception part Rx after unwanted signals are removed by the antenna multicoupler 7. The instruction information concerning the transmission output level of the transmission signal is included in the above-described reception signal from a base station.

A part of the transmission signal from the high output amplifier 4 is branched by the directional coupler 1, that is, taken out of an end of the sub line 1-2, and inputted to the detector 2 through the tuner 3.

In the detector 2, after the transmission signal is rectified by the detection diode D, the transmission signal is smoothed by the smoothing capacitor C1 and then changed into a detection signal by the load resistor R. This detection signal is outputted from the fourth terminal P4 as the TSSI signal corresponding to the transmission output level of the transmission signal actually being transmitted from antenna ANT and is then inputted to a control circuit 8.

A control part 9 gives a control signal to the control circuit 8 to indicate the target transmission output level. Based on the control signal from the control part 9, the control circuit 8 forms the feedback (FB) signal having such a value as to reduce the difference between the actual transmission output level as indicated by the TSSI signal and the target transmission output level. The feedback signal is outputted to a control terminal Tc which is capable of controlling the actual transmission output level of the high output amplifier 4.

As described above, a transmission output control system a part of which comprises a transmission output control device 10 forms a feedback loop in the transmission part Tx, and controls the transmission output level so that the actual transmission output level is the same as the target transmission output level given by the control part 9.

Figure 2:
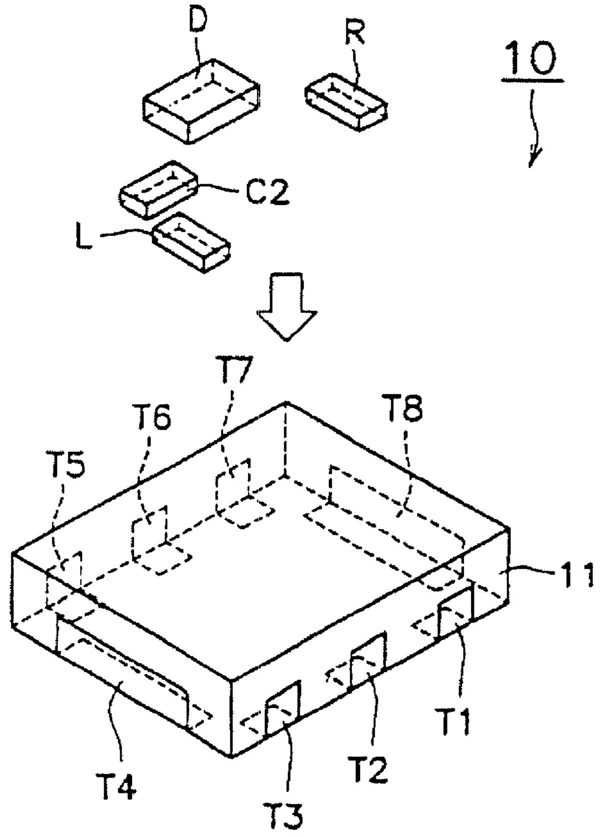
FIG. 2 is a partly exploded perspective view of the transmission output control device of FIG. 1.

FIG. 2 is a partly exploded perspective view of the transmission output control device of FIG. 1. The transmission output control device 10 is provided with a laminated body 11 in which a plurality of dielectric layers (not indicated in the figure) are laminated.

The detection diode D and the load resistor R of the detector 2, and the inductor L and the capacitor C2 of the tuner 3 are respectively mounted on an upper surface of the laminated body 11.

External terminals T1 to T8 extend from a side surface to a lower surface of the laminated body 11. Of these external terminals, the external terminals T7, T1, T3, T2, T5 respectively form the first to fifth terminals P1 to P5 (FIG. 1) of the transmission output control device 10 and the external terminals T4, T6, T8 form ground terminals.

Figure 3A:
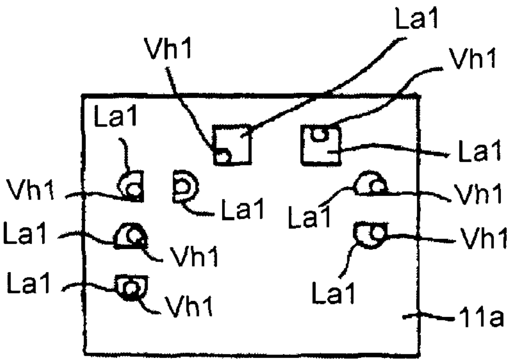
FIGS. 3A, 3B, 3C, 3D, 3E, 3F and 3G are top plan views of a first dielectric layer to a seventh dielectric layer which constitute a laminated body of the transmission output control device of FIG. 2.
Figure 3B:
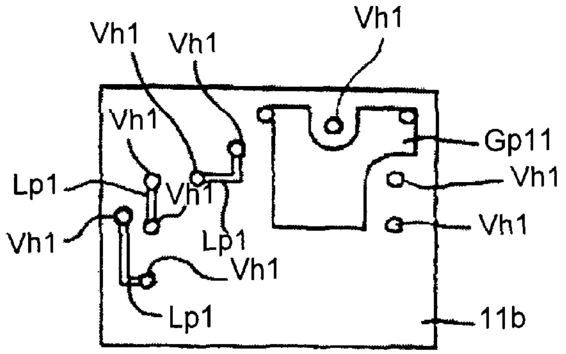
Figure 3C:
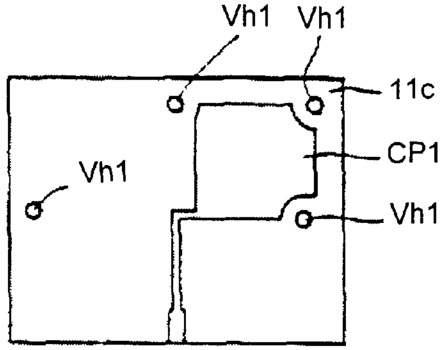
Figure 3D:
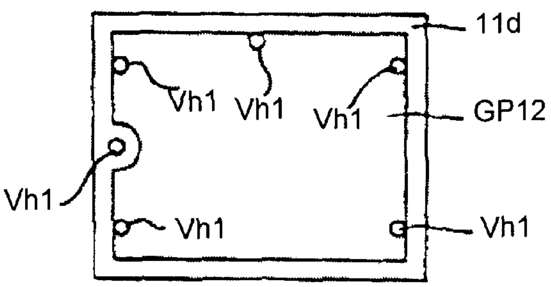
Figure 3E:
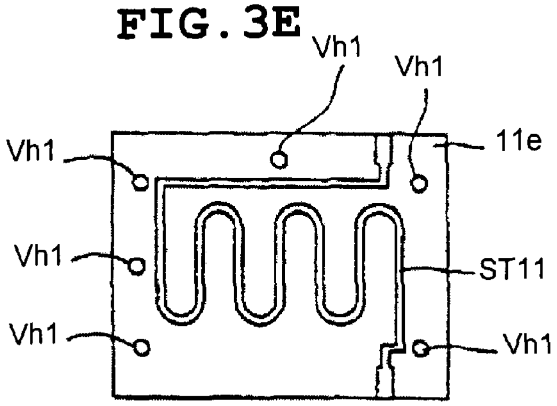
Figure 3F:
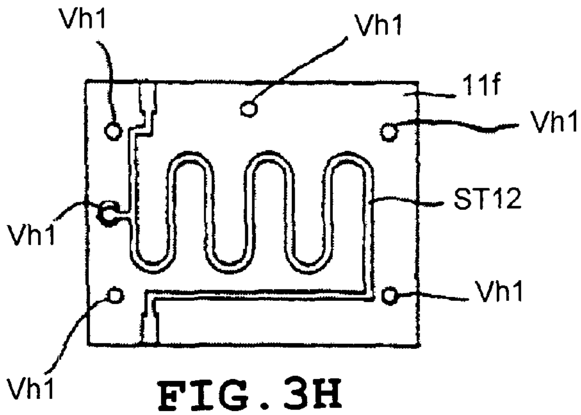
Figure 3G:
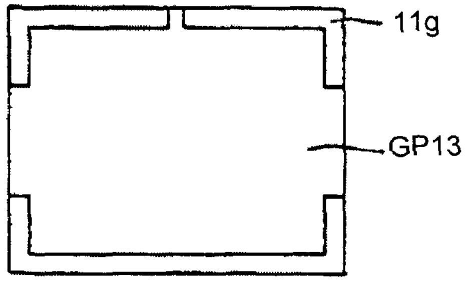
Figure 3H:
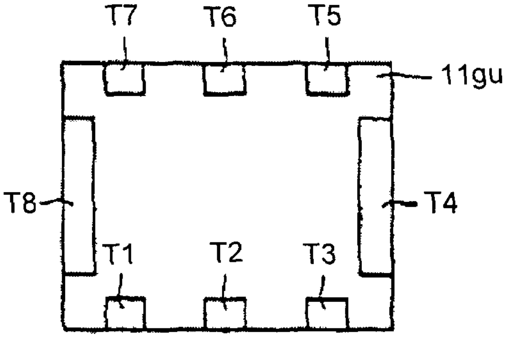
FIG. 3H is a bottom plan view of the seventh dielectric layer.

FIGS. 3A, 3B, 3C, 3D, 3E, 3F and 3G are top plan views of a first dielectric layer to a seventh dielectric layer which constitute a laminated body of the transmission output control device of FIG. 2, and FIG. 3H is a bottom plan view of the seventh dielectric layer. The laminated body 11 is formed, for example, by successively laminating and baking the first to seventh dielectric layers 11*a* to 11*g* formed of a low-temperature baked ceramic mainly consisting of barium oxide, aluminum oxide and silica which can be baked at the temperature of 850° C. to 1000° C.

A plurality of lands La1 to respectively mount the detection diode D of the detector 2, the load resistor R, and the inductor L and the capacitor C2 of the tuner 3 as illustrated in FIG. 1 are formed on an upper surface of the first dielectric layer 11*a*. A plurality of wiring patterns Lp1 (shown schematically) and a ground electrode Gp11 are formed on an upper surface of the second dielectric layer 11*b*.

In addition, a capacitor electrode Cp1 is formed on an upper surface of the third dielectric layer 11*c*. Ground electrodes Gp12, Gp13 are respectively formed on an upper surface of the fourth and seventh dielectric layers 11*d*, 11*g*.

In addition, strip line electrodes ST11, ST12 are respectively provided on an upper surface of the fifth and sixth dielectric layers 11*e*, 11*f*. The external terminals T1 to T8 are formed on a lower surface (denoted as 11 gu in FIG. 3H) of the seventh dielectric layer. In addition, a plurality of via hole electrodes Vh1 are formed in the first to sixth dielectric layers 11*a* to 11*f* so as to pierce at least one of the respective dielectric layers 11*a* to 11*f*.

The main line 1-1 of the directional coupler 1, and the sub line 1-2 of the directional coupler 1 respectively comprise the strip line electrode ST11 and the strip line electrode ST12.

Further, the smoothing capacitor C1 of the detector 2 comprises the capacitor electrode Cp1 and the ground electrodes Gp11, Gp12 opposite to each other across the second and third dielectric layers 11*b*, 11*c*.

In addition, the elements which constitute the directional coupler 1, the detector 2 and the tuner 3 are connected to each other by the wiring pattern Lp1 and the via hole electrode Vh1 inside the laminated body 11.

Although the wiring patterns Lp1 and via hole electrodes Vh1 are shown schematically and some reference numerals and interconnections may be omitted for clarity, it will be readily appreciated by those skilled in the art that the various elements shown and described can be interconnected to form the corresponding circuits shown in FIG. 1.

Figure 4:
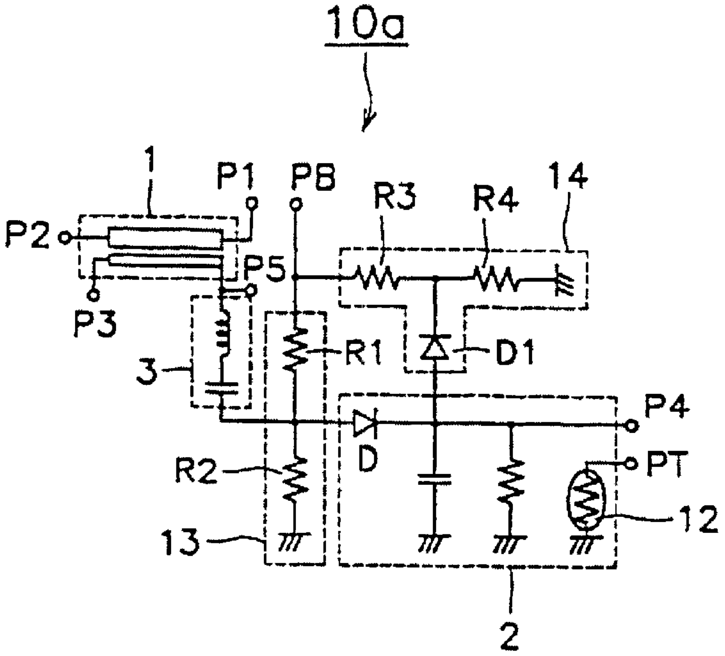
FIG. 4 is a circuit diagram of a modification of the transmission output control device of FIG. 1.

FIG. 4 is a circuit diagram illustrating a modified example of the output control device of FIG. 1. A transmission output control device 10*a* is different from the transmission output control device 10 of FIG. 1 in that the detector 2 is provided with a thermistor 12 which is a temperature-sensing element to compensate for temperature fluctuations, and an input part bias circuit 13 and an output limiter circuit 14 are provided between the tuner 3 and the detector 2.

The input part bias circuit 13 comprises resistors R1, R2, and a connection point where one end of the resistor R1 is connected to one end of the resistor R2 is connected to the anode of the diode D of the detector 2, and the other end of the resistor R2 is connected to ground.

The output limiter circuit 14 comprises a diode D1 and resistors R3, R4. The diode D1 is connected with its cathode connected to a connection point between one end of the resistor R3 and one end of the resistor R4 and its anode connected to the cathode of the detection diode D of the detector 2.

The other end of the resistor R3 is connected to the other end of the resistor R1 of the input part bias circuit 13, and is also connected to a control terminal PB to apply the bias of the diode D1. In addition, the other end of the resistor R4 is connected to ground.

Further, the thermistor 12, the resistors R1, R2 of the input part bias circuit 13, the diode D1 of the output limiter circuit 14, and the resistors R3, R4 are mounted on the upper surface of the laminated body 11. A detection terminal PT to take out the signal from the thermistor 12 and the control terminal PB to control the diode D of the output limiter circuit 14 are provided as external terminals bridging the side surface and the lower surface of the laminated body 11 as the external terminals, respectively.

In the transmission output control device of the first embodiment as described above, the directional coupler, the detector and the tuner which constitute the transmission output control device are integrated within the laminated body in which a plurality of dielectric layers are laminated, and the wiring which interconnects the directional coupler, the detector and the tuner can be provided inside the laminated body, and as a result, the loss in the wiring can be reduced. Thus, the transmission output control device with excellent characteristics can be obtained.

Because the main line and the sub line of the directional coupler comprise the strip line electrodes provided inside the laminated body, and the smoothing capacitor of the detector comprises the capacitor electrode and the ground electrode provided opposite to each other across a dielectric layer inside the laminated body, the number of parts of the transmission output control device can be reduced. Thus, a compact transmission output control device can be obtained, and the area occupied by the transmission output control device can be reduced. As a result, the radio equipment can be made compact while keeping its excellent transmission characteristics.

Further, in a modified example of FIG. 4, the temperature characteristic of the detector can be controlled because the detector is provided with the thermistor to compensate for temperature fluctuations, and the transmission output can be excellently controlled even when an extensive temperature compensation range is required.

The minimum value of the TSSI signal from the transmission output control device to the control circuit is determined by the input part bias circuit, and the maximum value of the TSSI signal from the transmission output control device to the control circuit is determined by the output limiter circuit. Thus, the range of the TSSI signal can be controlled, and as a result, the transmission characteristic of the radio equipment with this transmission output control device mounted thereon can be improved.

Figure 5:
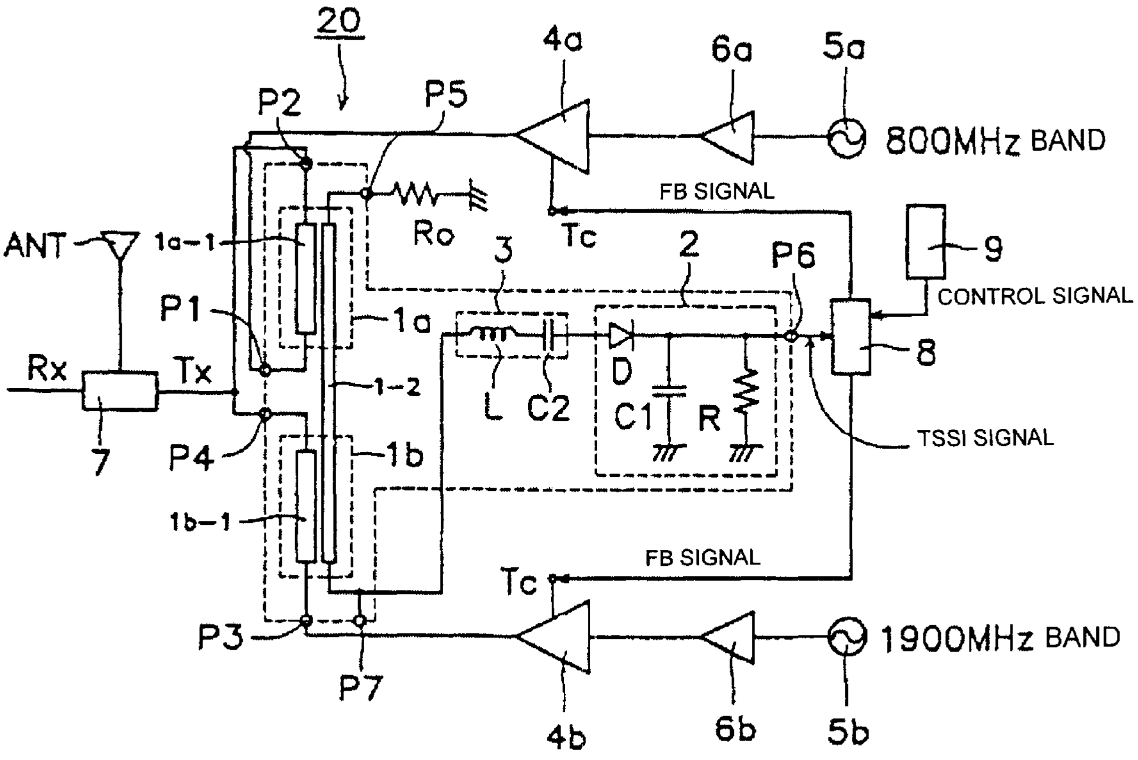
FIG. 5 is a block diagram illustrating a basic constitution of a transmission part of radio equipment using a second embodiment of the transmission output control device of the present invention.

FIG. 5 is a block diagram illustrating the basic constitution of a transmission part of radio equipment using the second embodiment of the transmission output control device of the present invention. In the transmission part Tx, a transmission output control device 20 is provided with a first directional coupler la comprising a main line 1*a*-1 having a length of $\lambda_1/4$ (wherein $\lambda_1$ is a wavelength corresponding to a transmission signal of a first frequency in the 800 MHZ band) and a common sub line 1-2, a second directional coupler 1*b* comprising a main line 1*b*-1 having a length of $\lambda_2/4$ (wherein $\lambda_2$ is a wavelength corresponding to a transmission signal of a second frequency in the 1900 MHZ band) and the common sub line 1-2, the detector 2 comprising the detection diode D, the smoothing capacitor C1 and the load resistor R, the tuner 3 comprising the inductor L and the capacitor C2, and the first to seventh terminals P1 to P7.

The first and second terminals P1, P2, and the third and fourth terminals P3, P4 are provided on the two ends of the main line 1*a*-1 of the first directional coupler 1*a*, and on both ends of the main line 1*b*-1 of the second directional coupler 1*b*, respectively. The fifth terminal P5 is provided on one end of the common sub line 1-2 of the first and second directional couplers 1*a*, 1*b*, and the terminating resistor Ro is connected thereto. In addition, the sixth terminal P6 is provided on an output end of the detector 2. The seventh terminal P7 is provided between the second directional coupler 1*b* and the tuner 3, and is used in evaluating the characteristics of the first and second directional couplers 1*a*, 1*b*.

The transmission output control system using the transmission output control device 20 is used in a dual-band type cellular phone terminal capable of responding to the AMPS (800 MHZ band) and the PCS (1900 MHZ band) with one cellular phone terminal, and its operation is described below, using the 800 MHz band side as an example.

The carrier-wave signal generated in an oscillator 5*a* is converted into the 800 MHZ transmission signal through various processing circuits including an amplifier 6*a*, and inputted to a high output amplifier 4*a*. The transmission signal amplified in this high output amplifier 4*a* is inputted to the antenna multicoupler 7 through the first terminal P1, the directional coupler 1*a* and the second terminal P2, and transmitted from the antenna ANT after unwanted signals are removed by the antenna multicoupler 7.

The reception signal received by the antenna ANT is inputted to the reception part Rx after unwanted signals are removed by the antenna multicoupler 7. The instruction information indicating the target transmission output level of the transmission signal is included in the above-described reception signal from a base station.

A part of the transmission signal from the high output amplifier 4*a* is branched by the directional coupler 1*a*, that is, taken out from one end of the common sub line 1-2 and inputted to the detector 2 through the tuner 3.

In the detector 2, the transmission signal is rectified by the detection diode D, is smoothed by the smoothing capacitor C1, and is converted to the detection signal by the load resistor R. The detection signal is outputted from the sixth terminal P6 as the TSSI signal corresponding to the present transmission output level of the transmission signal being actually transmitted from the antenna ANT, and is inputted to the control circuit 8.

The control part 9 gives the control signal to indicate the target transmission output level to the control circuit 8 according to the instruction from the base station not indicated in the figure. Based on the control signal from the control part 9, the control circuit 8 forms the feedback (FB) signal whose value is such that the difference between the actual transmission output level indicated by the TSSI signal and the target transmission output level is reduced, and the FB signal is outputted to the control terminal Tc for varying the actual transmission output level of the high output amplifier 4*a*.

As described above, the transmission output control system comprising a part of the transmission output control device 20 forms a feedback loop in the transmission part Tx, and controls the transmission output level so that the actual transmission output level becomes the target transmission output level given by the control part 9.

Figure 6:
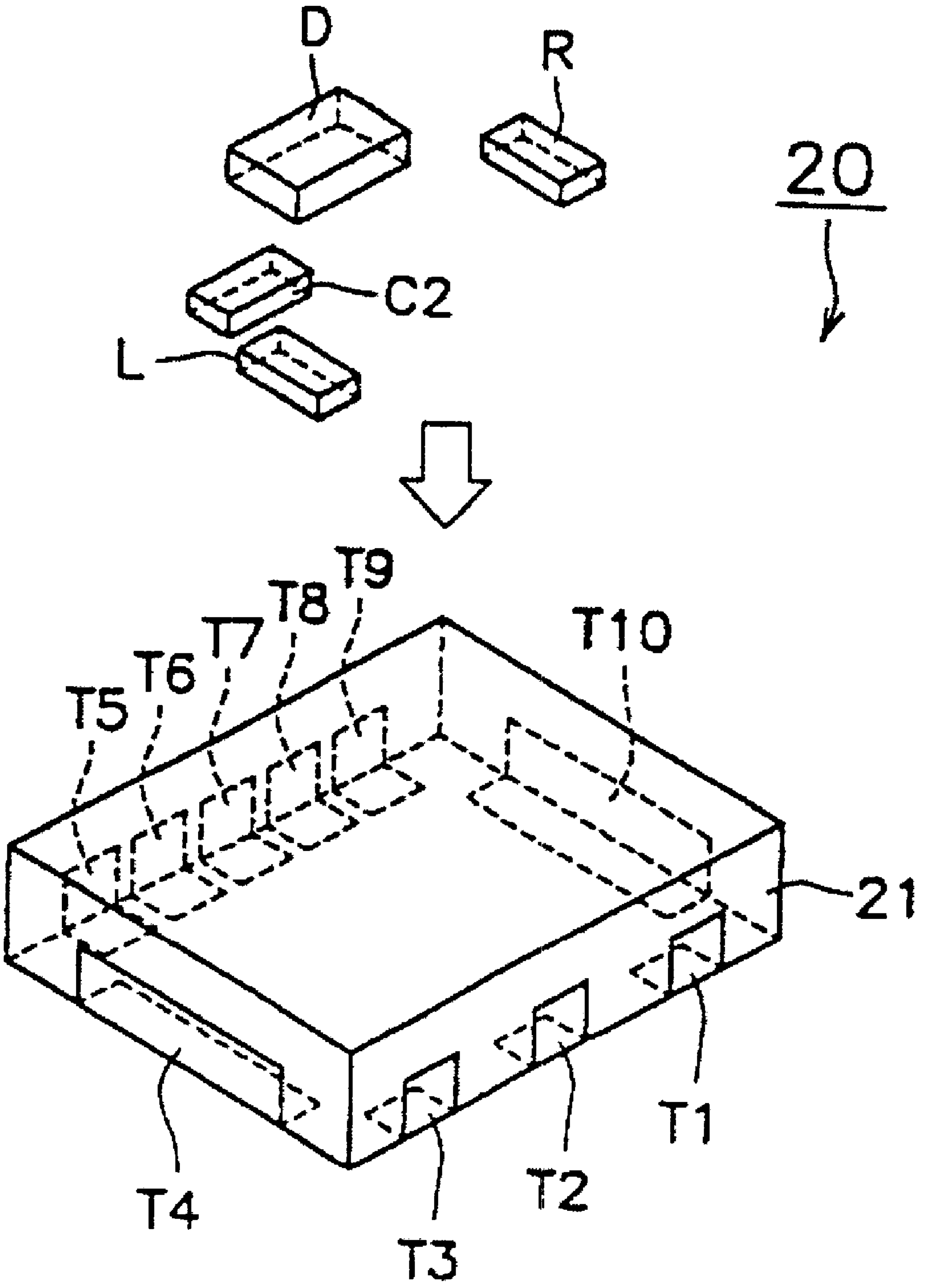
FIG. 6 is a partly exploded perspective view of the transmission output control device of FIG. 5.
Figure 7A:
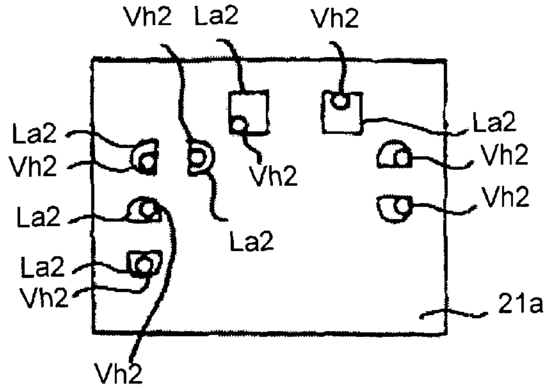
FIGS. 7A, 7B, 7C, 7D, 7E and 7F are top plan views of a first dielectric layer to a sixth dielectric layer which constitute a laminated body of the transmission output control device of FIG. 6.
Figure 7B:
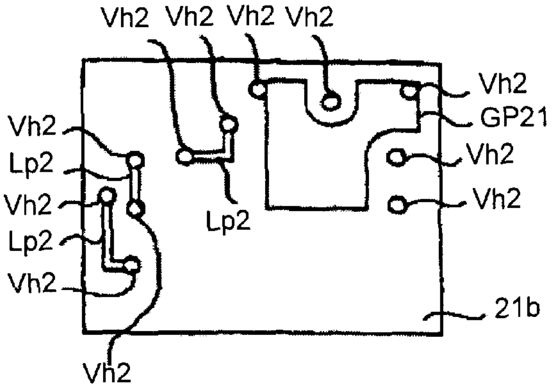
Figure 7C:
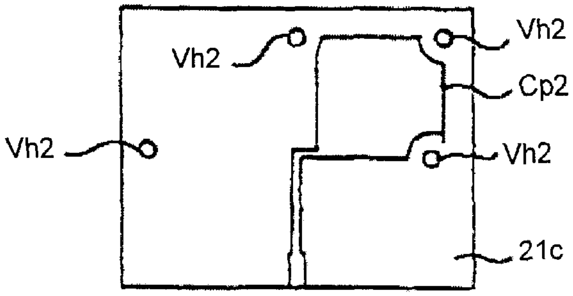
Figure 7D:
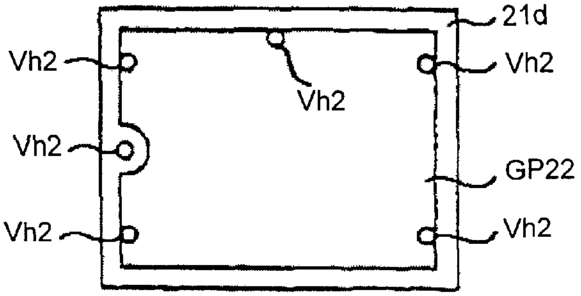
Figure 7E:
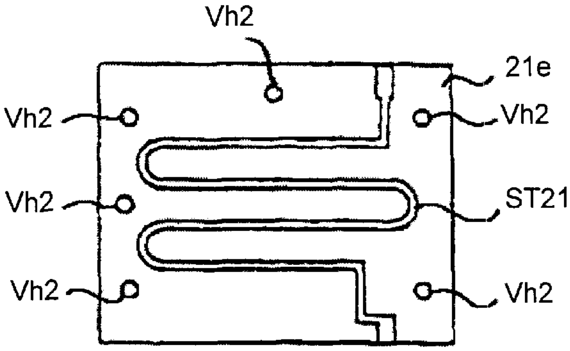
Figure 7F:
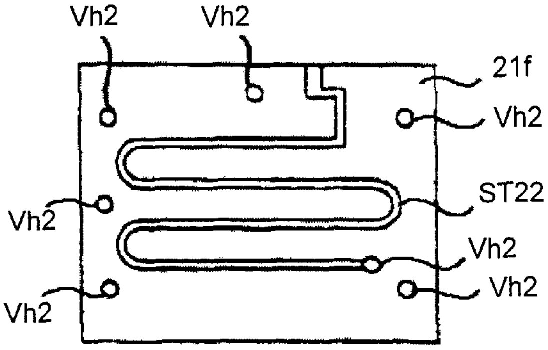

FIG. 6 is a partly exploded perspective view of the transmission output control device of FIG. 5. The transmission output control device 20 is provided with a laminated body 21 in which a plurality of dielectric layers (not indicated in the figure) are laminated.

The detection diode D and the load resistor R of the detector 2, and the inductor L and the capacitor C2 of the tuner 3 are respectively mounted on an upper surface of the laminated body 21.

External terminals T1 to T10 are provided bridging a side surface and a lower surface of the laminated body 21. Of these external terminals, the external terminals T1, T9, T5, T3, T8, T2, T6 respectively form the first to seventh terminals P1 to P7 (FIG. 5) of the transmission output control device 20 and the external terminals T4, T7, T10 form ground terminals.

Figure 8A:
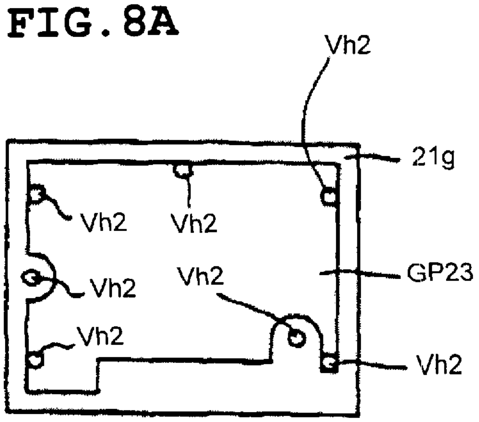
FIGS. 8A, 8B, 8C and 8D are top plan views of a seventh dielectric layer to a tenth dielectric layer which constitute a laminated body of the transmission output control device of FIG. 6.
Figure 8B:
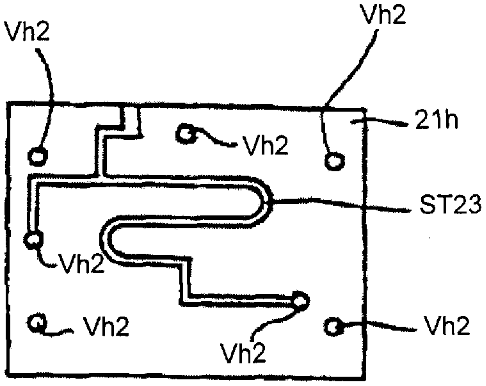
Figure 8C:
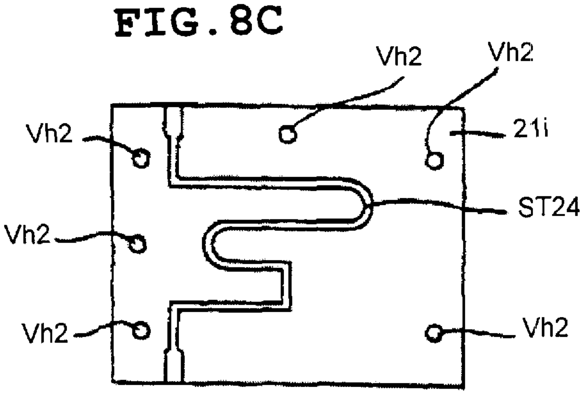
Figure 8D:
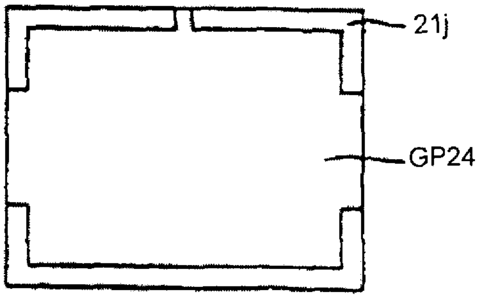
Figure 8E:
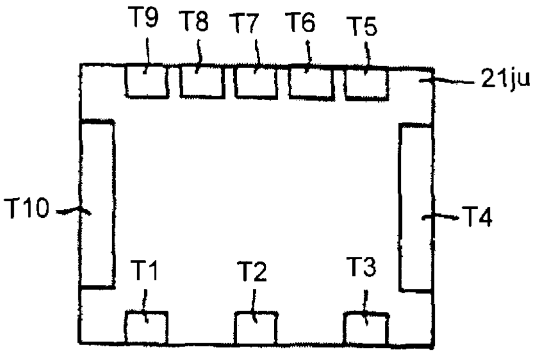
FIG. 8E is a bottom plan view of the tenth dielectric layer.

FIGS. 7A, 7B, 7C, 7D, 7E and 7F are top plan views of a first dielectric layer to a sixth dielectric layer which constitute a laminated body of the transmission output control device of FIG. 6. FIGS. 8A, 8B, 8C and 8D are top plan views of a seventh dielectric layer to a tenth dielectric layer which constitute a laminated body of the transmission output control device of FIG. 6, and FIG. 8E is a bottom plan view of the tenth dielectric layer. The laminated body 21 is formed, for example, by successively laminating and baking the first to tenth dielectric layers 21*a* to 21*j* formed of a low-temperature baked ceramic mainly consisting of barium oxide, aluminum oxide and silica which can be baked at the temperature of 850° C. to 1000° C.

A plurality of lands La2 to respectively mount the detection diode D of the detector 2, the load resistor R, and the inductor L and the capacitor C2 of the tuner 3 as illustrated in FIG. 5 are formed on an upper surface of the first dielectric layer 21*a*. A plurality of wiring patterns Lp2 (shown schematically) and a ground electrode Gp21 are respectively formed on an upper surface of the second dielectric layer 21*b*.

In addition, a capacitor electrode Cp2 is formed on an upper surface of the third dielectric layer 21*c*. Ground electrodes Gp22 to Gp24 are respectively formed on an upper surface of the fourth, seventh and tenth dielectric layers 21*d*, 21*g*, 21*j*.

In addition, strip line electrodes ST21 to ST24 are respectively formed on an upper surface of the fifth, sixth, eighth and ninth dielectric layers 21*e*, 21*f*, 21*h*, 21*i*. The external terminals T1 to T10 are formed on a lower surface (denoted as 21 ju in FIG. 8E) of the tenth dielectric layer. In addition, a plurality of via hole electrodes Vh2 are formed in the first to ninth dielectric layers 21*a* to 21*i* so as to pierce at least one of the respective dielectric layers 21*a* to 21*i*.

The main line 1*a*-1 of the first directional coupler 1*a*, and the main line 1*b*-1 of the second directional coupler 1*b* comprise the strip line electrode ST21 and the strip line electrode ST24, respectively.

The common sub line 1-2 of the first and second directional couplers 1*a*, 1*b* comprises the strip line electrodes ST22, ST23.

Further, the smoothing capacitor C1 of the detector 2 comprises the capacitor electrode Cp2 and the ground electrodes Gp21, Gp22 opposite to each other across the second and third dielectric layers 21*b*, 21*c*.

In addition, the elements which constitute the first and second directional couplers 1*a*, 1*b*, the detector 2 and the tuner 3 are connected to each other by the wiring pattern Lp2 and the via hole electrode Vh2 inside the laminated body 21.

Although the wiring patterns Lp2 and via hole electrodes Vh2 are shown schematically and some reference numerals and interconnections may be omitted for clarity, it will be readily appreciated by those skilled in the art that the various elements shown and described can be interconnected to form the corresponding circuits shown in FIG. 5.

Figure 9:
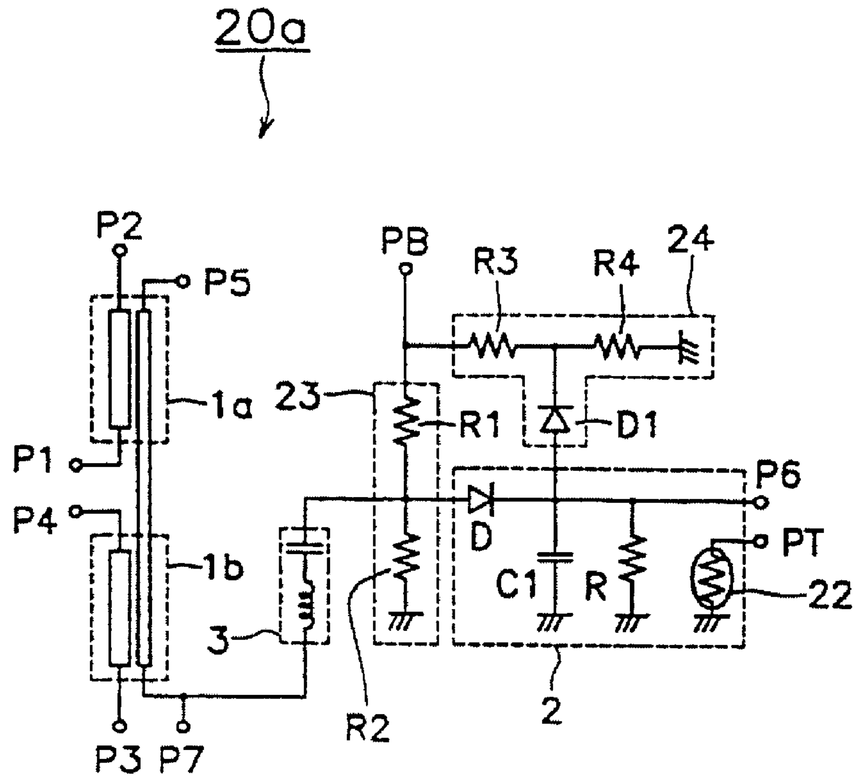
FIG. 9 is a circuit diagram of a modification of the transmission output control device of FIG. 5.
Figure 10:
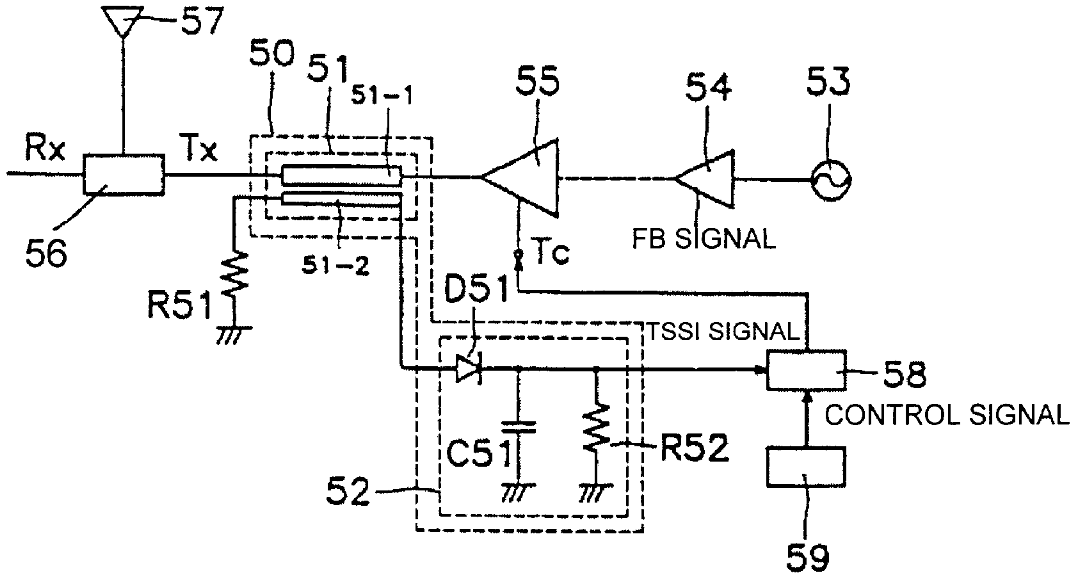
FIG.10 PRIOR ART
FIG. 10 is a block diagram illustrating a basic constitution of a transmission part of a conventional cellular phone terminal.
Figure 11:
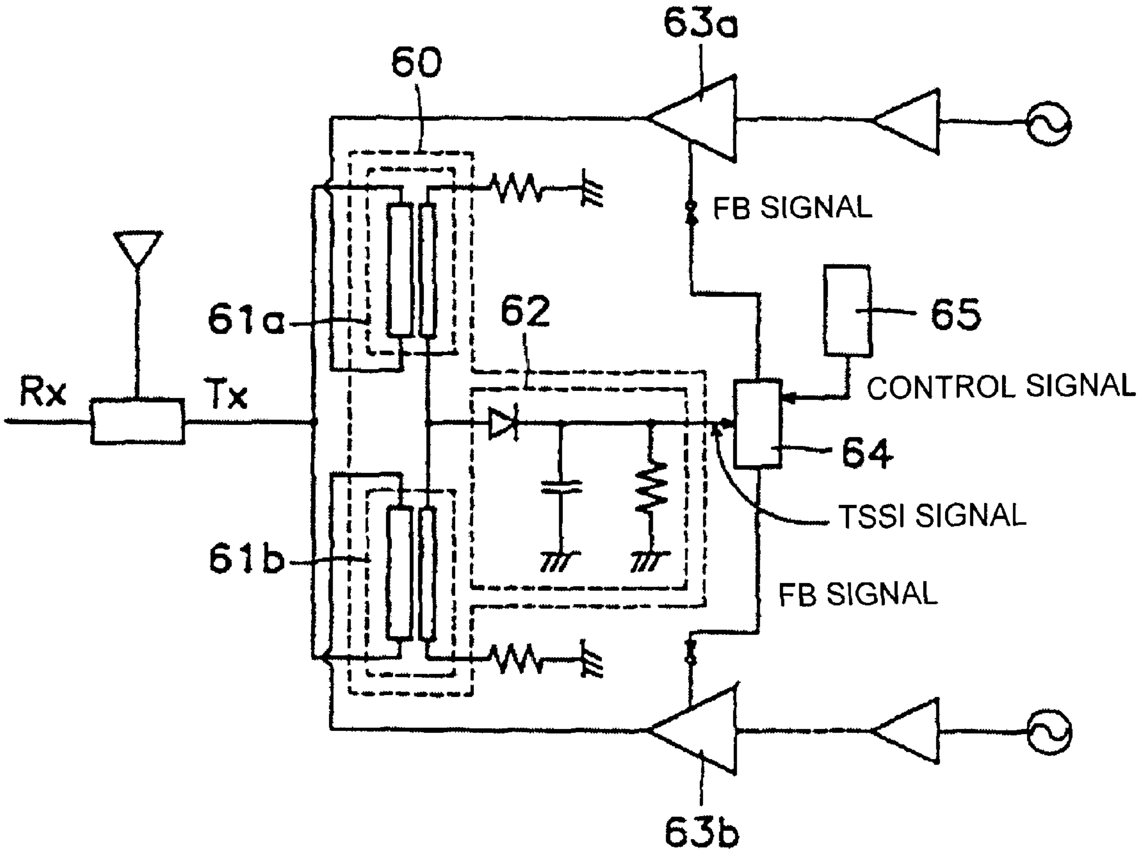
FIG. 11 PRIOR ART
FIG. 11 is a block diagram illustrating a basic constitution of a transmission part of a conventional dual-band type cellular phone terminal.

FIG. 9 is a circuit diagram illustrating a modified example of the output control of FIG. 5. A transmission output control device 20*a* is different from the transmission output control device 20 of FIG. 5 in that the detector 2 is provided with a thermistor 22 which is a temperature-sensing element to compensate for temperature fluctuations, and an input part bias circuit 23 and an output limiter circuit 24 are provided between the tuner 3 and the detector 2.

The input part bias circuit 23 comprises resistors R1, R2, and a connection point where one end of the resistor R1 is connected to one end of the resistor R2 is connected to an anode of the diode D of the detector 2, and the other end of the resistor R2 is connected to ground.

The output limiter circuit 24 comprises a diode D1 and resistors R3, R4, and the cathode of the diode D1 is connected to a connection point between one end of the resistor R3 and one end of the resistor R4. The cathode of the detection diode D of the detector 2 is connected to the anode of the diode D1.

The other end of the resistor R3 is connected to the other end of the resistor R1 of the input part bias circuit 23, and is also connected to a control terminal PB to apply the bias of the diode D1. In addition, the other end of the resistor R4 is connected to ground.

Further, the thermistor 22, the resistors R1, R2 of the input part bias circuit 23, the diode D1 of the output limiter circuit 24, and the resistors R3, R4 are mounted on the upper surface of the laminated body 21. A detection terminal PT to take out the signal from the thermistor 22 and the control terminal PB to control the diode D of the output limiter circuit 23 are arranged so as to bridge from the side surface to the lower surface of the laminated body 21 as external terminals.

In the transmission output control device of the second embodiment as described above, two directional couplers for receiving transmission signals of different frequencies are formed on different dielectric layers inside the laminated body, and thus, two directional couplers can be arranged on the dielectric layers.

Thus, in addition to the advantages of the first embodiment, sufficient isolation between two directional couplers can be ensured. As a result, the transmission output control device with excellent characteristics can be obtained.

Further, in a modified example of FIG. 9, the temperature characteristic of the detector can be controlled because the detector is provided with the thermistor to compensate for temperature fluctuations, and the transmission output can be excellently controlled over an extensive temperature compensation range.

The minimum value of the TSSI signal from the transmission output control device to the control circuit is determined by the input part bias circuit, and the maximum value of the TSSI signal from the transmission output control device to the control circuit is determined by the output limiter circuit. Thus, the range of the TSSI signal can be controlled, and as a result, the transmission characteristic of the radio equipment with this transmission output control device mounted thereon can be improved.

In the above-described first and second embodiments, the transmission output control device is provided with the tuner, but similar effects can be obtained even in a transmission output control device provided with no tuner.

Further, a one stage detector system is described above, but similar effects can be obtained even in a multiple stage detector system.

In addition, the modified first and second embodiments are provided with the detector having the thermistor, the input part bias part, and the output limiter circuit, but similar effects can be obtained even in an embodiment provided with only one or two of those three elements.

In the transmission output control device of the above-described second embodiment, the dual-band type transmission output control device is provided with two directional couplers. In addition, similar effects can be obtained with a transmission output control device provided with three or more directional couplers.

While the invention has been particularly shown and described with reference to embodiments thereof, it will be understood by those skilled in the art that the foregoing and other changes in form and details may be made therein without departing from the spirit of the invention.

What is claimed is:

1. A transmission output control device comprising:

a directional coupler for receiving and branching a part of an amplified transmission signal from an amplifier;

a detector which detects said branched transmission signal; and a first ground electrode;

wherein said directional coupler,said detector and said first ground electrode are integrated within a laminated body in which a plurality dielectric layers are laminated;

said directional coupler includes a main line which receives said amplified signals and a sub which outputs said branched signal;

said detector includes a detection diode which receives an output of said sub line, and a smoothing capacitor and a load resistor which receive an output off said detection diode and generate an output signal of said detector;

the main line and the sub line of said directional coupler comprise strip line electrodes provided inside said laminated body;

the smoothing capacitor of said detector comprises electrodes provided on opposite sides of one or more of said dielectric layers inside said laminated body;

the detection diode and the load resistor of said detector are mounted on said laminated body; and said first ground electrode is provided between said strip line electrodes and the electrodes of the smoothing capacitor.

2. The transmission output control device according to claim 1, further comprising a control circuit which receives said output signal of said detector and receives information representative of target output level, and provides a feedback signal to said amplifier to control said amplifier according to said target output level.

3. The transmission output control device according to claim 2, further comprising a tuner circuit connected between said sub line and said detector.

4. The transmission output control device according to claim 2, wherein said detector further comprises a bias circuit and a limiter circuit for setting a minimum and a maximum of said output signal of said detector, respectively.

5. The transmission output control device according to claim 2, wherein said detector further comprises a temperature-sensing element which is operable to compensate for temperature-induced fluctuations in said output signal of said detector.

6. The transmission output control device according to claim 1, further comprising a control circuit which receives an output signal from said detector and receives information representative of a target output level, and provides a feedback signal to said amplifier to control said amplifier according to said target output level.

7. Radio equipment including the transmission output control device according to claim 1, further comprising:

an amplifier connected to an input of said directional coupler; and

. an antenna circuit connected to an output of said directional coupler.

8. Radio equipment including the transmission output control device of claim 7, further comprising:

a pair of amplifiers connected respectively to said directional couplers for supplying thereto said corresponding signals of different respective frequencies; and an antenna circuit connected to an output of at least one of said directional couplers.

9. The transmission output control device according to claim 1, further comprising:

a second directional coupler configured for receiving as amplifier transmission signal of a different frequency than that received by said first mentioned directional coupler, said directional couplers being disposed different respective dielectric layers of said plurality of said dielectric layers.

10. Radio equipment including the transmission output control device of claim 9, further comprising:

a pair of amplifiers connected respectively to said directional couplers for supplying thereto said corresponding signals of different respective frequencies; and an antenna circuit connected to an output of at least one of said directional couplers.

11. Radio equipment including the transmission output control device according to claim 10, wherein said antenna circuit is connected to outputs of both of said directional couplers.

12. The transmission output control device according to claim 1, wherein the strip line electrodes of the main line and the sub line of the directional coupler are provided on different dielectric layers.

13. The transmission output control device according to claim 1, further comprising:

a second ground electrode arranged so as to be adjacent to a lower surface of the laminated body; wherein the strip line electrodes of the main line and the sub line of the directional coupler are sandwiched between the first ground electrode and the second ground electrode.

14. The transmission output control device according to claim 1, further comprising:

a second directional, coupler including strip line electrodes defining a main line and a sub line of the another directional coupler; wherein the strip line electrodes of the directional coupler are provided on different dielectric layers than the strip line electrodes of the directional coupler.

15. The transmission output control device according to claim 14, further comprising:

third ground electrode provided within said laminated body; wherein the third ground electrode is provided between the strip line electrodes of the directional coupler and the strip line electrodes of the second directional coupler.

* * * * *